(12) United States Patent
Blackshear

(10) Patent No.: US 7,095,104 B2
(45) Date of Patent: Aug. 22, 2006

(54) OVERLAP STACKING OF CENTER BUS BONDED MEMORY CHIPS FOR DOUBLE DENSITY AND METHOD OF MANUFACTURING THE SAME

(75) Inventor: Edmund D Blackshear, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 10/719,334

(22) Filed: Nov. 21, 2003

(65) Prior Publication Data
US 2005/0110125 A1 May 26, 2005

(51) Int. Cl.
H01L 23/52 (2006.01)
H01L 21/48 (2006.01)
H01L 23/495 (2006.01)
H01L 23/48 (2006.01)

(52) U.S. Cl. ............... 257/679; 257/686; 257/685; 257/777; 257/673; 257/723; 257/680; 257/698; 257/E25.012; 257/E23.064; 257/E23.145; 257/E23.176; 438/109; 438/108

(58) Field of Classification Search ............ 257/679, 257/680, 684–686, 723–728, 773–780, 673, 257/676, 696, 698, 691, 358, E25.012, E23.064, 257/E23.145, E23.176; 361/716, 719, 767, 361/782, 737, 738
See application file for complete search history.

(56) References Cited
U.S. PATENT DOCUMENTS 6,249,052 B1 * 6/2001 Lin ........................ 257/737
6,404,043 B1   6/2002 Isaak
6,573,567 B1 * 6/2003 Nishizawa et al. ......... 257/358
6,605,875 B1 * 8/2003 Eskildsen ................... 257/777
6,686,656 B1 * 2/2004 Koh et al. .................. 257/686
6,815,251 B1 * 11/2004 Akram et al. ............... 438/107
6,867,486 B1 * 3/2005 Hong ......................... 257/686
6,900,529 B1 * 5/2005 Kledzik et al. ............. 257/686
2001/0009505 A1   7/2001 Nishizawa et al.
2001/0010397 A1   8/2001 Masuda et al.
2002/0180060 A1   12/2002 Masuda et al.
2003/0137042 A1 * 7/2003 Mess et al. ................. 257/686
2005/0029645 A1 * 2/2005 Mess et al. ................. 257/686
2005/0077607 A1 * 4/2005 Hsieh et al. ................ 257/679
2005/0105318 A1 * 5/2005 Funaba et al. ............... 365/63

FOREIGN PATENT DOCUMENTS

WO   WO 01/80317 A1   10/2001

* cited by examiner

Primary Examiner—Alexander Oscar Williams
(74) Attorney, Agent, or Firm—DeLio & Peterson, LLC; Robert Curcio; Ira D. Blecker

(57) ABSTRACT

An approach to DRAM memory chip packaging leveraging the chip center position for wire bond pads to minimize time-of-flight and impedance effects resulting from stacking in a BGA application. A top layer of a dual device stack of center bus chips is stacked with an offset in a single direction with respect to a bottom layer of the dual device stack. The top layer of chips may be wire bonded to the opposite side of the module substrate. The center bus may be made to traverse to the substrate between two memory devices on the lower layer. To assemble the offset stacking devices into a high density module, devices are placed sequentially on a module substrate such that approximately one half of the protruding lower memory device is used as a support for the overhanging upper memory device chip of the next device stack.

15 Claims, 4 Drawing Sheets

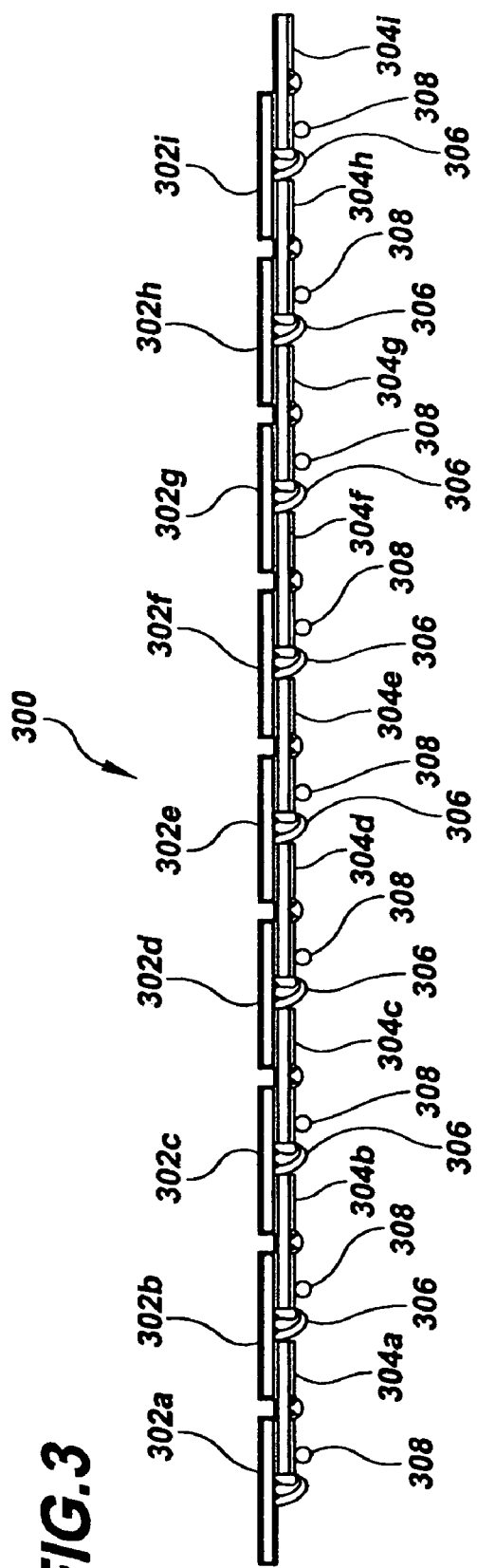

OVERLAP STACKING OF CENTER BUS BONDED MEMORY CHIPS FOR DOUBLE DENSITY AND METHOD OF MANUFACTURING THE SAME

BACKGROUND OF THE INVENTION

1. Field of the Invention

The present invention relates to a semiconductor device, and to a method of manufacturing the same. More particularly, the present invention relates to a semiconductor device structured to accommodate a high density of integrated circuit chips, and a technique for stacking these chips.

2. Description of Related Art

Memory (DRAM) packaging is entering a transition from TSOP to ball grid array at the single chip level. Since the 1970's, high-end server users of DRAMs have doubled their memory density by piggyback stacking of single chip devices. With the advent of area array footprints for DRAM, piggyback stacking is more difficult. Where peripheral lead frame packages lend themselves to piggyback stacking, Ball Grid Array's (BGAs) do not. DRAM memory chip packaging differs from other wirebonded devices in that addressing pads are positioned in the center of the chip rather than at its periphery. To stack area array modules, one or more wiring layers must be added between the vertical decks of the stack to fan signals out to the periphery of the lower device, then back into the BGA beneath it. This adds cost for additional substrates, as well as increased impedance, electrical noise, and time-of-flight delays to the circuit paths due to the additional wiring.

Vertical stacking of memory chips and packages has been the traditional method for doubling memory density on a given surface area. Electrical connections peripheral to the chip are used for common signals between the upper and lower devices. With decreasing memory access times, the impedance effects of memory packaging are becoming technology driven limitations. Generally, two or more memory chips are stacked one on another, while keeping their directions or orientations the same. The bonding pads of one memory chip are disposed in proximity to the bonding pads of the other memory chip. The upper memory chip is stacked over the lower memory chip.

For peripheral lead packaging of chips with center bond buses, packaging must include circuit traces to fan signals to the periphery. When using area array packaging of chips with center bond busses, stacking requires increasing the upper device trace length to fan out signals from the center to the periphery, and then back to the lower device. For example, in center bond bus DRAM in FBGA, center stacking of one chip to another causes signals from the top chip to travel a much greater distance traversing around the lower chip in order to escape the stack. Complex wiring structures having multiple solder interconnects are used to accomplish the wiring of this signal circuitry in the prior art. The resultant wiring generally exhibits higher impedance and degraded reliability than a non-stacked version.

FIGS. 1A–1C depict examples of the prior art stacking of chips having bus wiring at the edge of the chip and with center bond busses. Stacked integrated circuit chips 10 and 12 are shown with bus wiring 14, 16 attached to the substrate 18. In FIG. 1A, IC chips 10, 12 are stacked, one on top of another, with the bus wiring traversing in parallel directions to the substrate. In FIG. 1B, two chips 20, 22 with center busses 24, 26 are shown in a stacked configuration. Connecting the top IC 22 requires extending the bus wires 26 over the chips to the substrate 28 below. Connections for the bottom IC 20 may be made directly down onto the substrate top surface (not shown), or through a gap 29 in the substrate, with attachment to the substrate bottom surface or an inner layer therein. In another embodiment, shown in FIG. 1C, chips 30, 32 with center bus bonds 34, 36 are stacked over substrate 40 and attached by adhesive cement 38 therebetween. Again, connections require extension of the bus wires over each chip to the substrate.

In U.S. Patent Publication No. 2002/0180060, published on Dec. 5, 2002 and issued to Masuda, et al., entitled "SEMICONDUCTOR DEVICE AND A METHOD OF MANUFACTURING THE SAME," memory chips are mounted over a base substrate with one of them being overlapped with the upper portion of the other. They are stacked with their faces turned in the same direction. The bonding pads of one of the memory chips are disposed in the vicinity of the bonding pads of the other memory chip. Importantly, Masuda teaches offsetting the second semiconductor chip in a direction parallel to the first semiconductor chip and in a direction perpendicular to the first chip, such that the bus wires at the edge of each chip are offset when connected to the substrate. This facilitates visual inspection of the bus wire connections.

In International PCT Application No. WO 01/80317 issued to Helder on Oct. 25, 2001, entitled "SEMICONDUCTOR COMPONENT COMPRISING SEVERAL SEMICONDUCTOR CHIPS," semiconductor chips of a chip stack are arranged in an offset manner in relation to one another. Each chip is then connected to the series of conductors of the carrier substrate by electric connections. Importantly, Helder does not teach using chips having a center bus, nor are attachment schemes for center bus bonds disclosed.

The present invention avoids the added increase in trace length for connections from the upper device in the stack. Packaging is simplified in that long, multiple interconnects for escape of signals from the upper device are avoided. This configuration reduces cost while simultaneously increasing reliability. Electrical impedance, noise, and signal time of flight characteristics for the upper device are improved.

Bearing in mind the problems and deficiencies of the prior art, it is therefore an object of the present invention to provide an apparatus and method for promoting size and thickness reduction through the stacking of integrated circuit memory chips.

It is another object of the present invention to provide an apparatus and method for stacking chips having center bus bonds.

A further object of the invention is to provide an apparatus and method for reducing the manufacturing cost of a semiconductor device having a plurality of semiconductor chips stacked on one another.

It is yet another object of the present invention to provide an apparatus and method for decreasing memory access times and impedance effects through semiconductor topology.

An additional object of the invention is to provide a method for assembling offset stacked chips onto a memory module such that module memory density is nearly doubled, while retaining the advantages of offset stacked devices.

Still other objects and advantages of the invention will in part be obvious and will in part be apparent from the specification.

SUMMARY OF THE INVENTION

The above and other objects, which will be apparent to those skilled in art, are achieved in the present invention, which is directed to in a first aspect a high density memory card comprising: a module card on which there are assembled a plurality of dual device stacks each having a center bus wire, the plurality of dual device stacks including: a first lower layer memory device attached to a substrate, the substrate having a plurality of wire bond pads adjacent to an aperture in the substrate center for connection to the center bus wire; and a first upper layer memory device stacked on top of the first lower layer memory device such that the first upper layer memory device is offset over the first lower layer memory device exposing the center bus wire of the first upper layer memory device to some of the plurality of wire bond pads at an edge of the first lower layer memory device; the center bus wire of the upper layer memory device connected to the wire bond pads of the substrate around the edge of the first lower layer memory device.

The substrate has apertures therethrough such that the center bus wire of the upper layer memory device traverses through the aperture to wire bond pads on the opposite side of the substrate from that which the lower layer memory device is bonded.

Assembling the dual device stacks in an offset configuration, the dual device stacks are placed adjacent to one another in a line. The dual device stacks may also be placed in an array comprising rows and columns. The offset further includes placing an end of an upper layer memory device of a first dual device stack at the center of a lower layer memory device of a second dual device stack. The lower layer memory device attaches to the module card via ball grid arrays.

In a second aspect, the present invention is directed to a substrate having wire bond pads and a plurality of memory devices with center bus wires attached thereto, the substrate comprising: a first layer of the plurality of memory devices attached to the wire bond pads, adjusted such that a gap exists between adjacent first layer memory devices; and a second layer of the plurality of memory devices, each second layer device bonded to and on top of a first layer device such that the center bus wire of the second layer device traverses through the gap to the wire bond pads. The substrate further comprises the substrate having apertures therethrough such that the center bus wires of the second layer devices traverse through the apertures to wire bond pads on the opposite side of the substrate from that which the first layer memory devices are bonded. Each of the second layer devices is offset from the first layer devices underneath by approximately a device width, such that each of the second layer devices is centered with respect to the gaps.

In a third aspect, the present invention is directed to a method of assembling memory devices having center bus wires, the method comprising: providing a substrate having a top and bottom surface with wire bond pads for electrical connection; bonding a first dual device stack of memory devices having an upper memory device and a lower memory device to the wire bonds on the top surface of the substrate, the lower memory device placed adjacent to a lower memory device of a second dual device stack of memory devices, with gaps therebetween; and bonding a second dual device stack of memory devices to the first dual device stack of memory devices such that an upper memory device in the second dual device stack of memory devices is offset over the gap with the center bus wires traversing therethrough. The center bus wire of the upper memory device traverses through an aperture in the substrate to electrically connect with the wire bond pads on the substrate's bottom side. The offset is adjusted for approximately centering each of the upper memory devices of the dual device stack of memory devices over two adjacent lower memory devices of the dual device stack of memory devices. The dual device stacks of memory devices are placed adjacent to one another in a line. The dual device stacks of memory devices include forming an array of the dual device stacks of memory devices comprising rows and columns.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3 is a schematic of a double density stack of eighteen memory devices of the present invention.

DESCRIPTION OF THE PREFERRED EMBODIMENT(S)

Figure 1A:
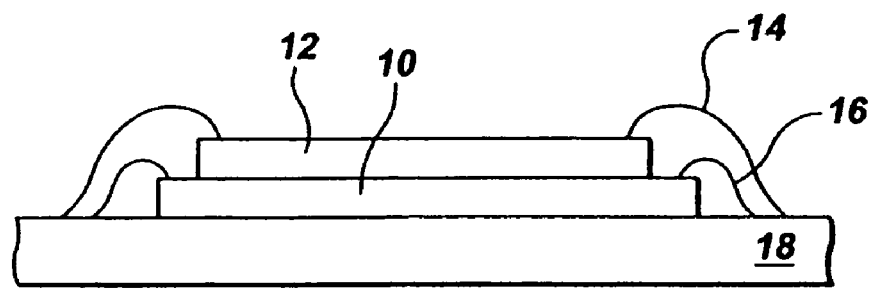
FIG. 1A is a prior art schematic of IC chips stacked one on top of another with the bus wiring traversing in parallel directions to the substrate.
Figure 1B:
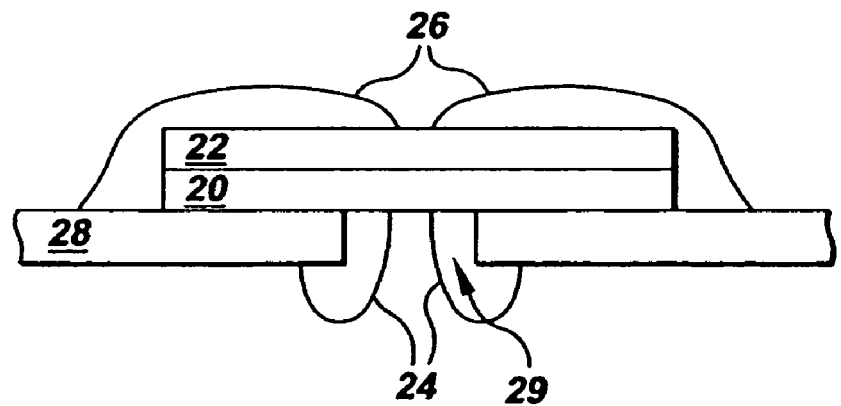
FIG. 1B is a prior art schematic of two chips with center busses shown in a stacked configuration.
Figure 1C:
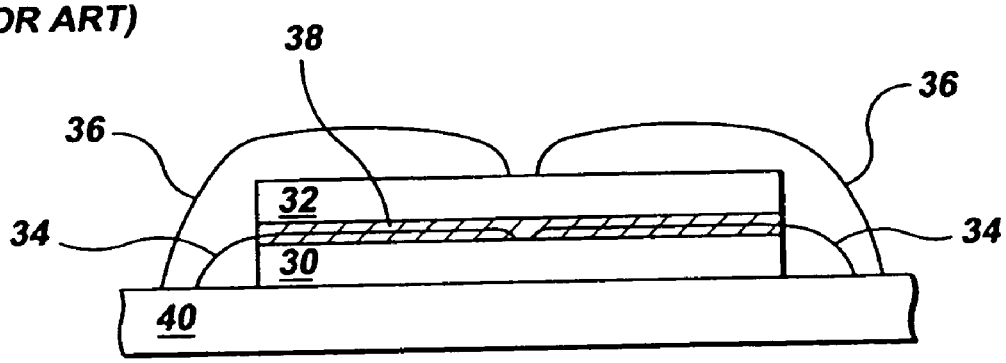
FIG. 1C is a prior art schematic of two chips with center bus bonds, stacked with adhesive cement therebetween.
Figure 2:
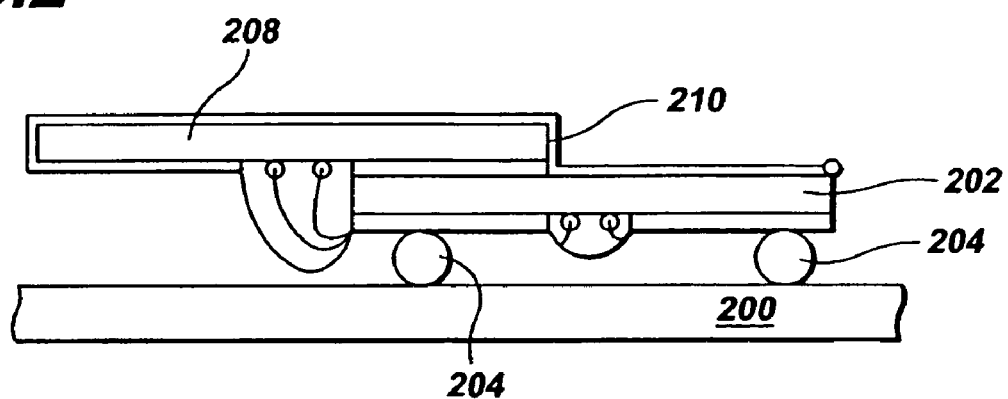
FIG. 2 is a partial schematic of a double density stack assembly of the present invention.

In describing the preferred embodiment of the present invention, reference will be made herein to FIGS. 1–3 of the drawings in which like numerals refer to like features of the invention.

This invention is an approach to DRAM memory chip packaging which leverages the chip center position for wire bond pads to minimize the time-of-flight and impedance effects resulting from stacking in a BGA application, as well as eliminate the need for additional substrates. In the invention, memory chips are stacked on and above each other with the active surface of the upper device bonded to the backside of the lower device by an adhesive layer. The position of the upper device is offset slightly over the chip width in bonding to the lower device such that the wire bond pads are exposed. This offset is preferably about 50% of the chip's width for a center bus bond.

The present invention has direct application to center bus memory chips, although it may not be limited strictly to these types of devices. In a center bus memory device, the bond wires attach to the center of the chip. The chip is then bonded face down to the substrate, with electrical connections maintained through an aperture or window in the substrate. In this case, the bond wires attach to the opposite side of the substrate from that which the chip is bonded. In a two-chip offset stacked configuration, the lower chip may bond to the substrate through an aperture, as does the conventional single chip device. The upper chip is mounted to the backside of the lower chip offset in a single axis, such that the center wire bond bus is exposed. Electrical connection of the upper chip is by bonding to the edge of the lower chip substrate. Most circuits on the lower chip substrate are shared in common by both chips. Addresses and data lines are common. Controls may be may be separate depending upon the stacked electrical configuration. Circuitry and solder balls on the lower device substrate are used to interconnect both chips in the stack with the next level of assembly. The assembled dual chip stack is covered by an encapsulating resin enclosing a portion of the surfaces or all surfaces and wirebonds, save the bondable surface of the substrate.

Importantly, the center bus chips are stacked with an offset in a single direction. The top layer of chips is wire bonded to the opposite side of the module substrate. The center bus is made to traverse to the substrate between two devices on the lower layer. To assemble the offset stacking devices into a high density module, devices are placed sequentially on a module substrate such that approximately one half of the protruding lower memory device is used as a support for the overhanging upper memory device chip of the next device stack. FIG. 2 is a partial schematic of a double density stack assembly of the present invention. A dual in-line memory module (DIMM) substrate 200 supports multiple layers of device memory chips. A discrete device or spacer 202 begins the lower layer assembly having connections to the substrate via ball grid arrays 204, or the like. An offset stacked DRAM is next placed such that the offset half of the upper device in the stack rests on the initial discrete device or spacer 202 for support. Subsequent offset stacked devices are then placed, each upper device 208 resting on the lower of the stack previously placed for support, fully populating the module. The exposed half of the lower chip in the final offset stack place remains uncovered.

In this dual device stack, a chip 208 representing the top layer is assembled over the lower layer, such that each top layer device may be centered to be approximately midway between two adjacent lower layer devices. In order to achieve this placement, the first top layer device 208 is seated on the first lower layer device 202 such that the top layer device's outer edge 210 is about at the center of the lower layer device. After assembly, the stack is ultimately covered in a protective resin or epoxy pursuant to existing manufacturing procedures for memory boards.

FIG. 3 depicts a module stack 300 of eighteen devices; nine upper layer devices 302a–302i and nine lower layer devices 304a–304i. Each upper layer device is shown with a center bus bond 306 traversing through adjacent lower layer devices. The lower layer devices are attached to a substrate (not shown) by ball grid arrays 308. A plurality of module stacks as depicted in FIG. 3 may be assembled to form an array of memory devices for a memory board.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A high density memory card comprising:
   a module card on which there are assembled a plurality of dual device stacks each having a center bus wire, said plurality of dual device stacks including:
   a first lower layer memory device attached to a substrate, said substrate having a plurality of wire bond pads adjacent to an aperture in said substrate center for connection to said center bus wire; and
   a first upper layer memory device stacked on top of, seated, and bonded directly to, said first lower layer memory device such that said first upper layer memory device is offset over said first lower layer memory device exposing said center bus wire of said first upper layer memory device to some of said plurality of wire bond pads at an edge of said first lower layer memory device;
   said center bus wire of said upper layer memory device connected to said wire bond pads of said substrate around said edge of said first lower layer memory device.

2. The memory card of claim 1 including said substrate having apertures therethrough such that said center bus wire of said upper layer memory device traverses through said aperture to said wire bond pads on the opposite side of said substrate from that which said lower layer memory device is bonded.

3. The memory card of claim 1 further including said dual device stacks placed adjacent to one another in a line.

4. The memory card of claim 3 wherein said dual device stacks are placed in an array comprising rows and columns.

5. The memory card of claim 1 wherein said offset further includes placing an end of an upper layer memory device of a first dual device stack at approximately the center of a lower layer memory device of a second dual device stack.

6. The memory card of claim 1 wherein said lower layer memory device attaches to said module card via ball grid arrays.

7. A substrate having wire bond pads and a plurality of memory devices with center bus wires attached thereto, said substrate comprising:
   a first layer of said plurality of memory devices attached to said wire bond pads, adjusted such that a gap exists between adjacent first layer memory devices; and
   a second layer or said plurality of memory devices, each second layer device seated and bonded directly to, and on top of, said first layer device such that said center bus wire of said second layer device traverses through said gap to said wire bond pads.

8. The substrate of claim 7 further comprising said substrate having apertures therethrough such that said center bus wires of said second layer devices traverse through said apertures to wire bond pads on the opposite side of said substrate from that which said first layer memory devices are bonded.

9. The substrate of claim 7 wherein each of second layer devices is offset from said first layer devices underneath by approximately a device width, such that each of said second layer devices is centered with respect to said gaps.

10. A method of assembling memory devices having center bus wires, said method comprising:
    providing a substrate having a top and bottom surface with wire bond pads for electrical connection;
    bonding a first dual device stack of memory devices having an upper memory device and a lower memory device to said wire bonds on said top surface of said substrate, said lower memory device placed adjacent to a lower memory device of a second dual device stack of memory devices, with gaps therebetween; and
    bonding and seating a second dual device stack of memory devices directly to top surfaces of said first dual device stack of memory devices such that an upper memory device in said second dual device stack of memory devices is offset over said gap with said center bus wires traversing therethrough.

11. The method of claim 10 further comprising having said center bus wire of said upper memory device traverse through an aperture in said substrate to electrically connect with said wire bond pads on said substrate's bottom side.

12. The method of claim 10 including having said offset adjusted for approximately centering each of said upper memory devices of said dual device stack of memory devices over two adjacent lower memory devices of said dual device stack of memory devices.

13. The method of claim 10 including placing said dual device stacks of memory devices adjacent to one another in a line.

14. The method of claim 13 wherein placing said dual device stacks of memory devices includes forming an array of said dual device stacks of memory devices comprising rows and columns.

15. The method of claim 10 including encapsulating some of said dual device stacks in resin on a portion of surfaces or all surfaces.

* * * * *